June 8, 1965 P. E. LA BEAUME 3,188,520
SEMICONDUCTOR COUNTER CIRCUIT FOR DRIVING DECADE INDICATOR
Filed June 27, 1962
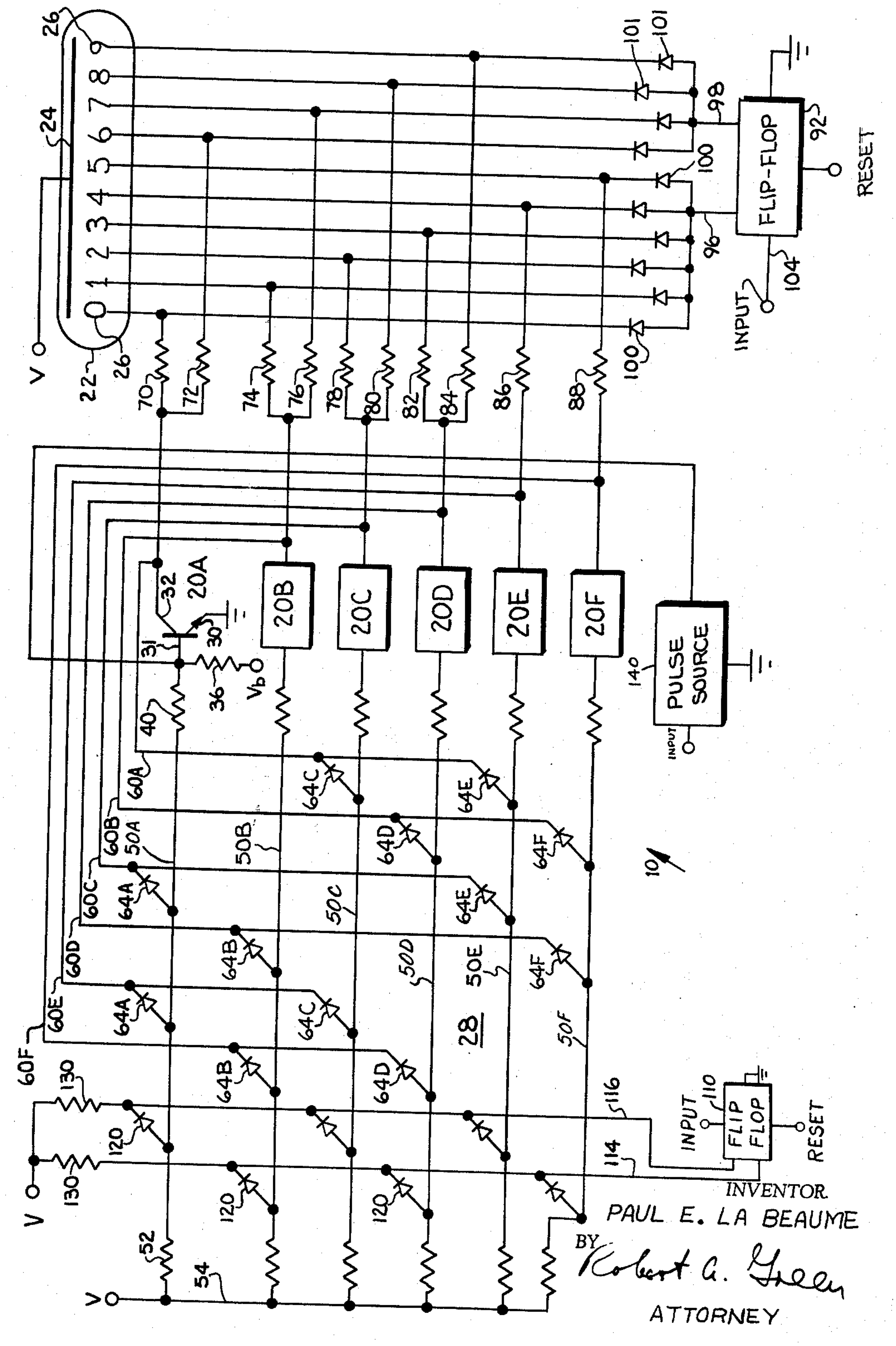
INVENTOR
PAUL E. LA BEAUME
BY Robert A. Green
ATTORNEY 3,188,520
Patented June 8, 1965

3,188,520

SEMICONDUCTOR COUNTER CIRCUIT FOR DRIVING DECADE INDICATOR

Paul E. La Beaume, Livingston, N.J., assignor to Burroughs Corporation, Detroit, Mich., a corporation of Michigan Filed June 27, 1962, Ser. No. 205,617
10 Claims. (Cl. 315—84.6)

This invention relates to electronic counter circuits and particularly to semiconductor counter circuits which include a diode matrix and which provide direct visible decimal representation of the counting operation.

One type of electronic semiconductor counter recently devised utilizes a diode matrix to transmit counting signals to a plurality of transistors, or the like, one transistor being provided for each counting step to provide decimal output logic. Such a circuit can be coupled directly to a decimal readout or indicator device to provide a direct visible indication of the counting operation. In this case, the readout device has one indicator element for each separate source of signal information. This type of cvircuit operates quite satisfactorily.

Another counter circuit which uses a diode matric combines binary-type circuit elements with a binary-type readout device to obtain a decimal indication of the counting operation. This circuit operates satisfactorily and is somewhat simpler in the number of parts employed than the first-mentioned counter.

The present invention achieves the same result, decimal readout, in a circuit which is simpler and more economical because it uses fewer transistors and diodes.

The objects of the present invention concern the provision of a relatively simple and inexpensive semiconductor counter utilizing a diode matrix and a series of counting devices in combination with a decimal readout device to provide a direct decimal representation of the counting operation.

For purposes of illustrating the principles of the invention, a decade counter is described. However, broader aspects of the invention will be clear to those skilled in the art. Briefly, a counter circuit embodying the invention includes a cold cathode gaseous indicator tube having an anode and ten cathode indicator electrodes which are arrayed in two groups, one including six cathodes and one including four cathodes. Six count registering devices, which are electron discharge devices and operate in the nature of switches, are coupled to a diode matrix, the indicator tube, and a source of counting pulses in a manner to execute ten counting steps in a counting cycle, with each count being displayed in the indicator tube.

The count registering devices are arrayed so that four operate two indicator cathodes separately and two operate one apiece, and the desired ten counts is thereby achieved. A source of counting pulses and a matrix of diodes are coupled to the count registering devices in such a way that one device at a time can register a count, and the count proceeds in the proper direction in the counting cycle.

The invention is described in greater detail by reference to the single figure of the drawing which is a schematic representation of a counter circuit embodying the invention.

The principles of the present invention are described with reference to a decade counter circuit 10 which, to provide a cycle of ten counts, includes six circuit logic elements 20A, 20B, 20C, 20D, 20E, and 20F which operate in the nature of switches and perform a binary type of operation. The six switch elements are electron discharge devices, preferably semi-conductor devices, which are shown and described as NPN transistors.

The six transistors are coupled to a ten-element readout device 22, a type 6844A tube, which includes an anode 24 and ten cathodes 26 which include numerals "0" to "9." The various counting devices are interrelated through a diode matrix 28 which is also used to couple counting pulses to the counting devices.

Where convenient in the following description, corresponding elements associated with each transistor carry the same reference numeral. However, each numeral carries a different letter designation which is derived from the associated transistor.

Since all of the transistors include the same electrodes, only one, transistor 20, is shown in detail. The others are shown as blocks. Each transistor includes emitter, base, and collector electrodes 30, 31, and 32, respectively. Each base electrode is coupled through a resistor 36 to a negative D.C. power source V*b* and through a bias resistor 40, lead 50, and resistor 52 to a bus 54 which is coupled to a positive D.C. power source V. Each emitter electrode 30 is connected to a source of reference potential such as ground.

The collector or output electrode 32 of each transistor is coupled through the diode matrix 28 to the inputs of all of the counting transistors except the next adjacent leading transistor as follows. The collector electrode of transistor 20, the first counting step, is coupled through output lead 60A and diodes 64C, 64D, 64E and 64F, oriented as shown, to the base or input electrodes of transistors 20C, 20D, 20E, and 20F, respectively, the third, fourth, fifth, and sixth steps in the counting chain. The output electrodes of transistor 20B, the second counting step, is coupled through its output lead 60B and diodes 64A, 64D, 64E, and 64F to the input electrodes of transistors 20A, 20D, 20E, and 20F, respectively, the first, fourth, fifth and sixth counting steps. The output electrodes of the other transistors are similarly connected to the inputs of all but the adjacent leading transistor in the counting cycle.

In addition, each collector output lead 60A, 60B, 60C, 60D, 60E, 60F is connected through a suitable resistive path to a source of bias potential V*c*.

The counting devices 20 are coupled to indicator tube 22 as follows. The output electrode 32 of the first transistor 20 is coupled through two separate resistive paths 70 and 72 to cathode numeral "0" and cathode numeral "6," respectively. The output electrode of transistor 20B is coupled through separate resistive paths 74 and 76 to cathode numerals "1" and "7," respectively. The output electrode of transistor 20C is coupled through separate resistive paths 78 and 80 to cathode numerals "2" and "8," respectively, and the output electrode of transistor 20D is coupled through separate resistive paths 82 and 84 to cathode numerals "3" and "9," respectively. The output electrode of transistor 20E is coupled through a resistor 86 to cathode numeral "4," and the output electrode of transistor 20F is coupled through a resistor 88 to cathode numeral "5."

A control flip-flop 92 for controlling the order of cathode selection in tube 22 includes a pair of output leads 96 and 98, one of which, 96, is connected through diodes 100, oriented as shown, to cathode numerals "0" to "5," inclusive. The other output lead 98 of the flip-flop 92 is coupled through diodes 101, oriented as shown, to cathode numerals "6" to "9," inclusive. The flip-flop 92 includes an input lead 104, by which switching signals are applied to the flip-flop, and a reset input, by means of which the flip-flop may be set to a desired state.

A counting flip-flop 110 having two output leads 114 and 116 is coupled to the diode matrix 28, with one output lead 114 being connected through diodes 120, oriented as shown, to the input leads 50 to transistors 20B, 20D, and 20F, respectively. The other output lead 116 of the counting flip-flop is coupled through diodes 120 to the input leads 50 of transistors 20A, 20C, and 20E, respectively. The ends of the leads 114 and 116 terminate in resistors 130 which are coupled to a suitable power source V. The flip-flop 110 is also provided with signal input and reset terminals.

The counting circuit of the invention also includes a source 140 of pulses for setting or resetting the counter to initiate a counting cycle. Such a pulse source may be coupled to the base electrode of transistor 20A and applies positive pulses thereto. The pulse source 140 is also suitably coupled to flip-flops 92 and 110 so that they are properly set at the beginning of a counting cycle.

In operation of the circuit of the invention, transistor 20A, the first counting step, is turned on by the application of a pulse from the pulse source 140, and the collector electrode thereof is reduced to about ground potential. At this time, the counting flip-flop 110 is set so that output lead 116 is at a positive potential, and positive potential derived from source V is coupled to the line 50A and thus to the base of transistor 20A. At the same time, the output lead 114 of the counting flip-flop 110 is at generally negative potential, and this potential is coupled through diodes 120 to leads 50B, 50D, and 50F to the bases of transistors 20B, 20D, and 20F, respectively, which are thus held off. The ground potential of the collector of transistor 20A is coupled through its output lead 60A and diodes 64C, 64E and 64F to the inputs of transistors 20C and 20D, 20E, and 20F which are thus held off. Thus, all transistors are off except transistor 20A.

At this time, the cathode control flip-flop 92 is set so that output lead 96 is at a generally negative potential and output lead 98 is at a generally positive potential so that diodes 100 are reverse-biased and diodes 101 are biased in the forward direction. With this arrangement of the diodes 100 and 101, cathode numerals "6" to "9" are held at a relatively high positive potential which prevents them from glowing even though the transistor collector to which each is coupled is lowered in potential. On the other hand, cathode numerals "0" to "5," which are coupled to reverse-biased diodes 100, can be lowered sufficiently in potential by the collector electrode of an "on" transistor to exhibit cathode glow.

Thus, when transistor 20A is turned on, cathode numeral "0" glows to indicate the start of a counting cycle.

The application of a counting pulse to the input of flip-flop 110 reverses the potentials on the output leads 114 and 116 and applies a positive potential to the base or input electrode of transistor 20B, which is thus turned on. The resulting generally negative potential on the output lead 116, coupled through the diodes 120, holds off transistors 20A, 20C, and 20E, and the ground potential of the collector electrode of "on" transistor 20B holds off transistors 20A, 20D, 20E, and 20F. The ground potential of the collector electrode of transistor 20B is applied to the cathode numerals "1" and "7" of tube 22, and cathode numeral "1" glows. The application of the next counting pulse to the counting flip-flop 110 reverses the potentials on its output leads and turns on transistor 20C. All of the other transistors are held off through the various diode connections as described above. Cathode numeral "2" is caused to glow. The next counting pulse turns on transistor 20D, and all of the other transistors are held off. The activation of transistor 20D turns on cathode numeral "3."

The next counting pulse turns on transistor 20E and causes all of the other transistors to be turned off. Transistor 20E turns on cathode numeral "4." The next counting pulse turns on transistor 20F and cathode numeral "5." The application of the next counting pulse causes transistor 20A to be turned on again, and, at the same time, the control flip-flop is caused to change state, by the application of a suitable input pulse, whereby the diodes 101 are reverse-biased and thus set to allow cathodes "6" to "9" inclusive to glow, and diodes 100 are forward-biased so that cathodes "0" to "5" inclusive cannot glow. Thus, when transistor 20A is turned on for the second time, cathode numeral "6" is turned on. The application of subsequent counting pulses turn on, in order, transistor 20B and cathode numeral "7," transistor 20C and cathode numeral "8," and transistor 20D and cathode numeral "9." The counting cycle of ten counts is thus completed. The counting cycle may be repeated by resetting and turning on transistor 20A and properly setting the flip-flops 92 and 110 as described above.

The invention described above thus provides a relatively simple and economical decade counter using semiconductor devices. Various modifications may be made within the scope of the invention, and such modifications will occur to those skilled in the art. For example, the various set and reset operations may be arranged to be performed by a single pulse source. In addition, some reset operations may be effected by pulses obtained from the counting transistors themselves.

What is claimed is:

1. A counter circuit including a cold cathode gaseous indicator tube including an anode and a plurality of cathode indicator electrodes, said cathode electrodes being arranged in two groups, cathode control means coupled to said groups of cathodes for rendering said groups separately operable, separate switch means each coupled to a pair of cathodes including one cathode from each group for energizing a pair of cathodes, other switch means each coupled to a single cathode electrode, and means coupled to said switch means for separately energizing each in order.

2. The circuit defined in claim 1 wherein each switch means comprises a transistor and said cathode control means comprises a flip-flop.

3. The circuit defined in claim 1 wherein each switch means comprises a transistor and said cathode control means comprises a flip-flop, said flip-flop having two outputs, each coupled to one group of said cathodes.

4. The circuit defined in claim 1 wherein each switch means comprises a transistor having an input electrode and an output electrode, the output electrode of each transistor being coupled to and adapted to energize one cathode electrode in each group, and said cathode control means comprises a flip-flop having two output lines, one output of said flip-flop being connected through a first set of diodes to one group of said cathodes and the other output of said flip-flop being connected through a second set of diodes to the other group of cathodes, said flip-flop biasing one set of diodes in the reverse direction and thereby preventing the associated transistors from energizing this one set of cathode electrodes, said flip-flop biasing the other set of diodes in the forward direction whereby the group of cathodes coupled to this other set of diodes is rendered operative and the other group is rendered inoperative.

5. The circuit defined in claim 1 wherein each switch means comprises a transistor having an input electrode and an output electrode, each transistor output electrode being coupled to and adapted to cause one cathode in each of the two groups of cathodes to glow, and said cathode control means comprises a flip-flop having two output lines, one output of said flip-flop being connected through a first set of diodes to one group of said cathodes and thus to a group of transistor output electrodes, and the other output of said flip-flop being connected through a second set of diodes to the other group of cathodes and to another group of transistor output electrodes, said flip-flop in one state biasing one set of diodes in the reverse direction and thus preventing the transistor output electrodes which are connected thereto from energizing the associated cathode indicator electrodes, said flip-flop in the one state biasing the other set of diodes in the forward direction and thus enabling the transistor output electrodes which are connected thereto to energize the associated cathode indicator electrodes, said flip-flop thus being adapted to render one group of cathodes operative during the cycle of operation of said transistors, said flip-flop thus being adapted to render the other group of cathodes operative during the cycle of operation of selected ones of said transistors whereby a complete counting cycle is effected.

6. The circuit defined in claim 1 wherein six switch means are provided and each comprises a transistor having an input electrode and an output electrode, and said cathode control means comprises a flip-flop having two output lines, one output of said flip-flop being connected through a first set of diodes to one group of six cathodes and to the output electrodes of said six transistors and the other output of said flip-flop being connected through a second set of diodes to the other group of four cathodes and to the output electrodes of four of said six transistors, said flip-flop in one state biasing one set of diodes in the reverse direction and the other set of diodes in the forward direction whereby the diodes which are biased in the forward direction render the transistors, to which they are connected, able to cause the cathodes to which they are connected to glow, and the diodes which are biased in the reverse direction prevent the transistors to which they are connected from causing cathode glow, said flip-flop thus being adapted, by biasing one set of diodes in the forward direction, to render one group of cathodes operative able to glow during the cycle of operation of said six transistors, said flip-flop when it changes state being adapted, by biasing the other set of diodes in the forward direction, to render the other group of cathodes able to glow during the cycle of operation of four of said six transistors.

7. The circuit defined in claim 1 wherein each switch means comprises a transistor having an input electrode and an output electrode, and said cathode control means comprises a flip-flop having two output lines, one output of said flip-flop being connected through a first set of diodes to one group of said cathodes and the other output of said flip-flop being connected through a second set of diodes to the other group of cathodes, said flip-flop in one state biasing one set of diodes in the reverse direction and thus rendering the set of cathodes which are connected thereto able to glow, said flip-flop at the same time biasing the other set of diodes in the forward direction and thus rendering the set of cathodes which are connected thereto unable to glow during the cycle of operation of said transistors, said flip-flop being adapted to be switched in state to reverse the operability of said cathodes, one group of cathodes being operable by all of said transistors, the other group of cathodes being operable by selected ones of said transistors, a complete counting cycle being effected by the operation in order first of all of said transistors and then by said selected ones of said transistors.

8. The circuit defined in claim 1 wherein each switch means comprises a transistor having an input electrode and an output electrode, and said cathode control means comprises a flip-flop having two output lines, one output of said flip-flop being connected through a first set of diodes to one group of said cathodes and the other output of said flip-flop being connected through a second set of diodes to the other group of cathodes, said flip-flop biasing one set of diodes in the reverse direction and thus rendering the set of cathodes which are connected thereto able to glow, said flip-flop at the same time biasing the other set of diodes in the forward direction and thus rendering the set of cathodes connected thereto unable to glow during the cycle of operation of said transistors, said flip-flop being adapted to be switched in state to reverse the operability of said cathodes, a diode matrix, said transistors being interconnected through said diode matrix so that only one transistor is operative at a time, and a source of counting pulses coupled to said diode matrix for rendering said transistors operative in order and for assisting in rendering only one transistor operative at a time.

9. A counter circuit including a cold cathode gaseous indicator tube including an anode and ten cathode indicator electrodes, said cathode electrodes being arranged in two groups with different numbers of cathode electrodes in each group, cathode control means coupled to said groups of cathodes for applying biasing potentials separately to one or the other of said groups and thus rendering said groups separately operable when glow potentials are applied thereto by a switch means, separate switch means each coupled to a pair of cathodes including one cathode from each group for energizing a pair of cathodes, there being four of such pairs of cathodes, other switch means each coupled to a single cathode electrode, there being two of such single cathodes, and means coupled to said switch means for separately energizing each in order, said cathode control means being adapted to properly energize said cathodes in order also.

10. The circuit defined in claim 9 wherein said cathode control means renders one group of cathodes operative during the cycle of operation of said switch means, said cathode control means rendering the other group of cathodes operative during the operation of selected ones of said switch means whereby a complete counting cycle is effected.

References Cited by the Examiner

UNITED STATES PATENTS 3,095,522 6/63 Kitz et al. ______________ 315—84

ARTHUR GAUSS, *Primary Examiner.*

UNITED STATES PATENT OFFICE
CERTIFICATE OF CORRECTION

Patent No. 3,188,520 June 8, 1965

Paul E. La Beaume

It is hereby certified that error appears in the above numbered patent requiring correction and that the said Letters Patent should read as corrected below.

Column 2, lines 23 and 24, for "the inputs of all" read -- others --; lines 24 and 25, strike out "except the next adjacent leading transistor"; line 27, for ", 64D, 64E and 64F" read -- and 64E --; line 29, for ", 20D, 20E, and 20F" read -- and 20E --; line 30, for ", fourth, fifth, and sixth" read -- and fifth --; line 31, for "electrodes" read -- electrode --; line 33, for "64A, 64D, 74E," read -- 64D --; line 34, for "20A, 20D, 20E," read -- 20D --; line 35, for "first, fourth, fifth" read -- fourth --; same line 35, after "steps." insert the following:

> The output electrode of transistor 20C, the third counting step, is coupled through output lead 60C and diodes 64A and 64E to the input electrodes of transistors 20A and 20E, respectively, the first and fifth counting steps. The output electrode of transistor 20D, the fourth counting step, is coupled through its output lead 60D and diodes 64B and 64F to the input electrodes of transistors 20B and 20F, respectively, the second and sixth counting steps. The output electrode of transistor 20E, the fifth counting step, is coupled through its output lead 60E and diodes 64A and 64C to the input electrodes of transistors 20A and 20C, respectively, the first and third counting steps; and the output electrode of transistor 20F is coupled through its output lead 60F and diodes 64B and 64D to the input electrodes of transistors 20B and 20D, respectively, the second and fourth counting steps.

same column 2, line 35, beginning with "The" strike out all to and including "potential Vc." in line 41, same column 2; column 3, li 28, for ", 64E and 64F" read -- and 64E --; line 29, for "20D, 20E and 20F" read -- 20E, --; same column 3, line 55, for "20A, 20D, 2 and 20F" read -- 20D and 20F --.

Signed and sealed this 14th day of December 1965.

(SEAL)
Attest:

ERNEST W. SWIDER
Attesting Officer

EDWARD J. BRENNER
Commissioner of Patents